United States Patent
Burdine et al.

(10) Patent No.: US 7,225,374 B2
(45) Date of Patent: May 29, 2007

(54) ABIST-ASSISTED DETECTION OF SCAN CHAIN DEFECTS

(75) Inventors: Todd Michael Burdine, Wappingers Falls, NY (US); Donato Orazio Forlenza, Hopewell Junction, NY (US); Orazio Pasquale Forlenza, Hopewell Junction, NY (US); William James Hurley, Poughkeepsie, NY (US); Steven Michnowski, Wappingers Falls, NY (US); James Bernard Webb, Wallkill, NY (US)

(73) Assignee: International Business Machines Corporation, Armonk, NY (US)

( * ) Notice: Subject to any disclaimer, the term of this patent is extended or adjusted under 35 U.S.C. 154(b) by 468 days.

(21) Appl. No.: 10/728,348

(22) Filed: Dec. 4, 2003

(65) Prior Publication Data
US 2005/0138514 A1 Jun. 23, 2005

(51) Int. Cl.
*G01R 31/28* (2006.01)
(52) U.S. Cl. .................................... 714/726
(58) Field of Classification Search ............... 714/724, 714/726–729; 716/4
See application file for complete search history.

(56) References Cited

U.S. PATENT DOCUMENTS

| | | | | |
|---|---|---|---|---|
| 4,503,386 A | * | 3/1985 | DasGupta et al. | 714/731 |
| 5,313,424 A | * | 5/1994 | Adams et al. | 365/200 |
| 5,640,402 A | * | 6/1997 | Motika et al. | 714/731 |
| 5,657,332 A | * | 8/1997 | Auclair et al. | 714/763 |
| 5,859,804 A | * | 1/1999 | Hedberg et al. | 365/201 |
| 5,951,703 A | | 9/1999 | Sprouse et al. | |
| 6,278,956 B1 | * | 8/2001 | Leroux et al. | 702/117 |
| 6,308,290 B1 | * | 10/2001 | Forlenza et al. | 714/724 |
| 6,385,750 B1 | | 5/2002 | Kapur et al. | |
| 6,442,720 B1 | | 8/2002 | Koprowski et al. | |
| 6,618,826 B1 | | 9/2003 | Chen et al. | |
| 6,662,327 B1 | | 12/2003 | Rajski | |
| 6,694,454 B1 | * | 2/2004 | Stanley | 714/30 |

(Continued)

FOREIGN PATENT DOCUMENTS

| JP | 62195169 A | * | 8/1987 |
|---|---|---|---|
| JP | 06230075 A | * | 8/1994 |

OTHER PUBLICATIONS

Gate Level Fault Diagnosis in Scan Based BIST by Bayraktaroglu et al Proceedings of the 2002 Design automation and test in Europe Conference 1530-1591/02 IEEE.*
R. W. Basset et al., "Boundary-Scan Design Principles for Efficient LSSD ASIC Testing," IBM J. Res. Develop., vol. 34, No. 2/3, Mar./May 1990, pp. 339-354.

(Continued)

*Primary Examiner*—Cynthia Britt
(74) *Attorney, Agent, or Firm*—Wood, Herron & Evans, LLP

(57) ABSTRACT

An apparatus, program product and method utilize an ABIST circuit provided on an integrated circuit device to assist in the identification and location of defects in a scan chain that is also provided on the integrated circuit device. In particular, a defect in a scan chain may be detected by applying a plurality of pattern sets to a scan chain coupled to an ABIST circuit, collecting scan out data generated as a result of the application of the plurality of pattern sets to the scan chain, and using the collected scan out data to identify a defective latch in the scan chain.

20 Claims, 4 Drawing Sheets

U.S. PATENT DOCUMENTS

| | | |
|---|---|---|
| 6,807,646 B1 | 10/2004 | Williams et al. |
| 6,950,974 B1 | 9/2005 | Wohl et al. |
| 6,993,694 B1 | 1/2006 | Kapur et al. |
| 7,058,869 B2* | 6/2006 | Abdel-Hafez et al. ...... 714/729 |
| 2002/0125907 A1* | 9/2002 | Kurtulik et al. ............ 324/765 |
| 2003/0131294 A1 | 7/2003 | Motika et al. |
| 2004/0003329 A1 | 1/2004 | Cote et al. |

OTHER PUBLICATIONS

Guo et al., "A Technique for Fault Diagnosis of Defects in Scan Chains", IEEE, paper 10.2, 2001, pp. 268-277, USA.

Giuseppe A. Sarrica et al., "Theory and Implementation of LSSD Scan Ring & STUMPS Channel Test and Diagnosis," Sep. 28-20, 1992; Electronics Manufacturing Technology Symposium, 1992; Thirteenth IEEE/CHMT International, pp. 195-200.

* cited by examiner

ABIST-ASSISTED DETECTION OF SCAN CHAIN DEFECTS

FIELD OF THE INVENTION

The invention relates to testing and diagnosis of defects in integrated circuits, and in particular, to testing and diagnosis of scan chain defects in integrated circuits.

BACKGROUND OF THE INVENTION

Integrated circuit devices, commonly known as chips, continue to become more powerful and complex as semiconductor manufacturing technologies have advanced. Whereas early integrated circuit devices included fewer than one hundred transistors, it is now common to integrate several million transistors into a single integrated circuit device. This increased transistor count enables some operations that once required several integrated circuit devices to now be implemented in a single integrated circuit device, often providing greater performance at a lower cost.

One effect of the increase in the complexity of integrated circuit devices, however, is that testing of the manufactured devices has become significantly more complex and time consuming. Early integrated circuit devices often had enough input/output pins to enable all of the relevant internal operations of a device to be monitored to ensure that the device operated in its intended manner. However, with current designs incorporating millions of transistors and numerous high level functions, it is impracticable to provide sufficient input/output connectivity to enable direct monitoring of device operation.

To address these limitations, many integrated circuit devices now incorporate a boundary scan architecture within the logic circuitry of a device to provide access to many of the internal circuits of the device. With a boundary scan architecture, one or more serial scan chains, or scan paths, of latches are coupled to dedicated pins of a device, with individual latches embedded within the logic circuitry of the device at key points of the design. The latches, when not specifically configured to operate as a scan chain, do not otherwise alter the functionality of the device. However, when the latches are configured in a specific mode, the latches together operate as a shift register so that data may be shifted into the chain of latches from a single source to simulate different conditions, and so that data generated within a device may be shifted out through a single output. Thus, with a boundary scan architecture, the current state of various circuits in a device at any given time may be recorded and later accessed via external equipment to verify the operation of a manufactured device.

Additional efforts to enhance device testability incorporate built-in self-test (BIST) circuitry into individual devices to perform predetermined testing operations on the device without the assistance of external circuitry, e.g., upon power-up of a device. For example, for logic devices such as processors and controllers, logical built-in self-test (LBIST) circuitry may be used to apply pseudo-random test patterns to logic gates to verify their correct operation.

Similarly, array built-in self-test (ABIST) circuitry may be used to apply test patterns to memory arrays embedded in an integrated circuit device to verify the correct operation of such arrays. ABIST typically applies address, data and control information to an array and clocks the array to first write test patterns to the array. Thereafter, ABIST again applies address, data and control information and clocks the array to read out the stored test patterns to a scan chain or a Multiple-Input Shift Register (MISR). Differences between the written test patterns and the output data indicate potential defects in an array.

One common failure mechanism that arises relatively early in the design of an integrated circuit device is a broken scan chain, typically resulting from the manufacture of a defective latch in the scan chain. Conventional attempts to detect broken scan chains include flush and scan tests. A flush test, for example, holds the clock signals to each latch in a scan chain in an active state such that a value asserted on the input to the scan chain propagates through all of the latches to the scan chain output. By applying logic one and logic zero values to the scan chain input, an identical value should propagate to the scan chain output (taking into account any inversions in the scan chain). Otherwise, a broken scan chain is likely present.

A scan test, on the other hand, consists of applying a string of alternating logic values (e.g., 00 11 00 11 . . . ) to the input of a scan chain, and stepping the data along the scan chain by pulsing the clock inputs thereto. A break in a scan chain (typically as a result of a fault that causes a clock line to remain asserted), is typically indicated if anything other than the original input string is detected at the output of the scan chain.

While flush and scan tests are capable of detecting broken scan chains, they are not capable of detecting where the break in a scan chain is located. Moreover, since many of the other tests employed in chip testing utilize the scan chains to pass data to, or retrieve data from, an integrated circuit device, these tests cannot themselves be utilized to assist in diagnosing broken scan chains.

Therefore, a significant need exists in the art for an improved manner of detecting a defect in a scan chain, and in particular, for a manner of identifying a specific location of a defect in a scan chain.

SUMMARY OF THE INVENTION

The invention addresses these and other problems associated with the prior art by providing an apparatus, program product and method that utilize an ABIST circuit provided on an integrated circuit device to assist in the identification and location of defects in a scan chain that is also provided on the integrated circuit device. In particular, consistent with the invention a defect in a scan chain may be detected by applying a plurality of pattern sets to a scan chain coupled to an ABIST circuit, collecting scan out data generated as a result of the application of the plurality of pattern sets to the scan chain, and using the collected scan out data to identify a defective latch in the scan chain.

By applying pattern sets to a scan chain via one or more ABIST circuits, the pattern sets may be inserted laterally into the scan chain, rather than having to be scanned in serially. In many embodiments, this enables non-defective latches disposed downstream of a defective latch in a scan chain to be verified as non-defective, given that the data path from the ABIST circuit, to the non-defective latches, and to the scan out interface of the scan chain does not pass through the defective latch. As a result, in many embodiments, a defective latch may be identified as that latch immediately upstream of the earliest non-defective latch positively identified in the scan chain.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments discussed hereinafter utilize an ABIST circuit resident in an integrated circuit device to detect defects in a scan chain resident on the same device. As will become more apparent below, conventional scan chain testing relies on passing data along a scan chain, with input data provided to the input of the scan chain and passed along the scan chain from latch to latch until it is output at the output of the scan chain. The presence of a defective latch in a scan chain, however, compromises or corrupts the data in each subsequent latch in the scan chain.

In contrast, by utilizing an ABIST circuit, test patterns may be laterally applied to a scan chain, such that the capture of data by a particular latch in the scan chain is not dependent upon preceding latches in the scan chain. As a result, a defect in a preceding latch will generally not affect the capture of data by a subsequent latch. Moreover, this enables non-defective latches disposed downstream of a defective latch in a scan chain to be positively verified as non-defective, given that the data path from the ABIST circuit, to the non-defective latches, and to the scan out interface of the scan chain does not pass through the defective latch. As such, in many instances, analysis of the scan out data can positively identify the location of a defective latch as that latch immediately upstream of the earliest non-defective latch positively identified at the end of the scan chain.

Figure 1:
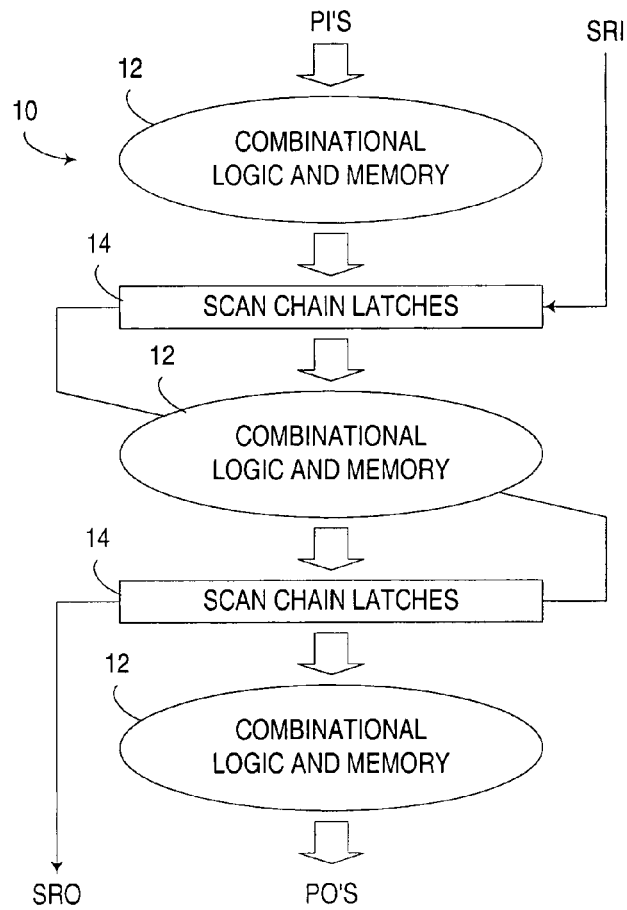
FIG. 1 is a block diagram of an exemplary integrated circuit device incorporating a boundary scan architecture.

Turning now to the Drawings, wherein like numbers denote like parts throughout the several views, FIG. 1 illustrates an abstracted representation of an integrated circuit device, or chip 10, which incorporates one or more blocks of combinational logic and memory 12 with which is integrated a boundary scan architecture comprising one or more sets of scan chains 14.

In normal operation, combinational logic and memory blocks 12 respond to one or more primary inputs (PI's) and output one or more primary outputs (PO's). Interspersed among blocks 12 are latches disposed into one or more scan chains 14, which in one mode, are transparent to the chip from a functional standpoint, but which in another mode may be collectively configured into one or more shift registers that are responsive to external shift register inputs (SRI's) and that output data via external shift register outputs (SRO's).

Figure 2:
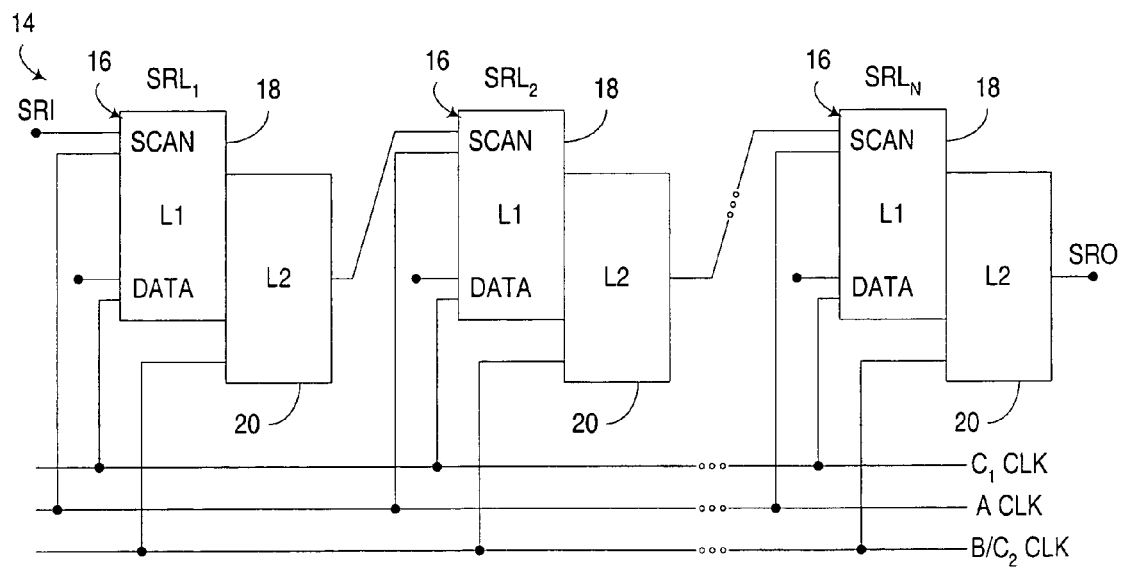
FIG. 2 is a block diagram of the scan chain latches referenced in FIG. 1.

While a number of different scan chain implementations may be used consistent with the invention, FIG. 2 illustrates one suitable implementation of a scan chain 14, as a Level Sensitive Scan Design (LSSD) where each scan chain latch 16 is implemented using a pair of latches 18, 20, also designated herein as latches L1 and L2. Each L1 latch 18 functions as a master latch having a pair of data ports (SCAN and DATA) that may be captured by the latch responsive either to a first scan clock (A CLK) or a first functional system clock ($C_1$ CLK). Each L2 latch 20 functions as a slave latch that captures the value stored in master latch L1 responsive to either a second scan clock (B CLK) or a second functional system clock ($C_2$ CLK). As shown in FIG. 2, in some implementations the second scan clock and second functional system clock may be combined, resulting in a single B/$C_2$ clock signal. Regardless of whether the B and $C_2$ clock signals are combined, however, each signal is typically driven out of phase with both L1 clocks.

When operating in a functional mode, each latch 16 captures data generated by the functional circuitry on the chip, and thereafter outputs the data to other functional circuitry on the chip, resulting in effective functional transparency of each latch 16 during functional operation of the chip. However, when operating in a test mode, latches 16 may be used as "pseudo-primary" inputs to functional circuitry that receives the output of each latch, by scanning in serial data from the SRI input for the scan chain and "walking" the data down the scan chain through successive assertions of the A/B clocks. Likewise, latches 16 may also be used as "pseudo-primary" outputs by scanning out functional data captured in the scan chain latches via the SRO output, again through successive assertions of the A/B clocks.

As such, whenever it is desirable to test a particular functional circuit's response to particular input data, the desired data can be scanned into the appropriate latches in a scan chain, the functional circuit can be activated to process the input data until appropriate output data is stored in the scan chain latches, and the output data can be scanned out of the scan chain for analysis.

It will be appreciated that multiple scan chains may be provided on a given chip, and moreover, that some designs permit multiple scan chains to be configured either as individual scan chains or as a single combined scan chain. It will also be appreciated that the embedding of scan chains into an integrated circuit design so as to provide desirable points to insert test data, capture output data, or both, is highly design dependent. Moreover, scan-based design to provide the desired points of input and output for a particular functional design would be well within the abilities of one of ordinary skill in the art having the benefit of the instant disclosure.

Figure 3:
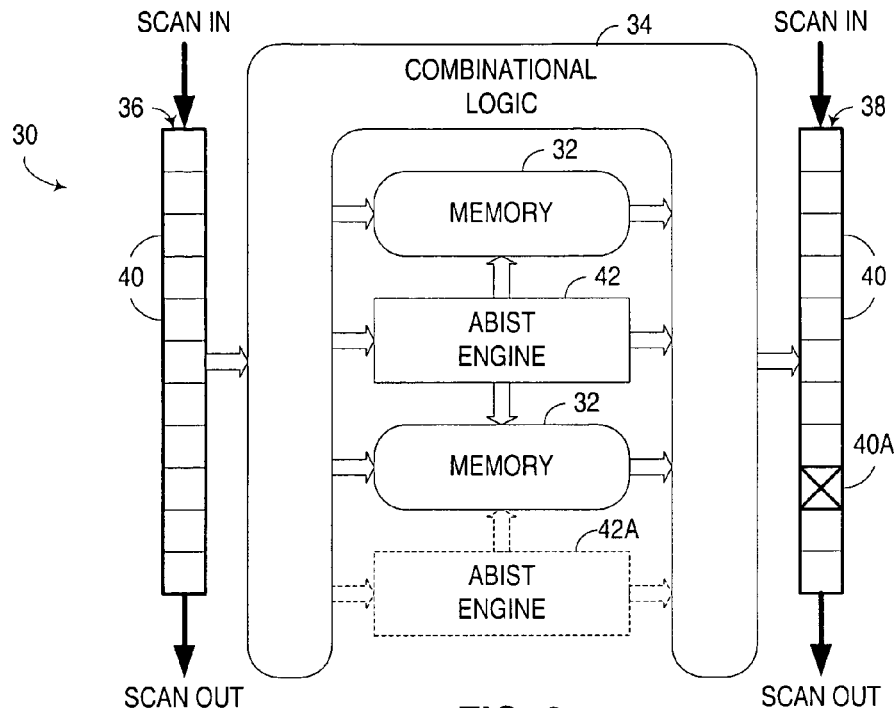
FIG. 3 is a block diagram of another exemplary integrated circuit device incorporating a scan chain with a defective latch.

Now turning to FIGS. 3 and 4, as noted above, a defect in one or more latches in a scan chain, which results in a "broken" scan chain, is often problematic, particularly early in the design cycle of an integrated circuit device. FIG. 3, in particular, illustrates a portion of an exemplary integrated circuit device 30 including a plurality of memory arrays 32 surrounded by combination logic 34. Two scan chains 36, 38, each including a plurality of latches 40, may respectively provide input to, and receive output from, memories 32 and logic 34. It will be appreciated that scan chains 36, 38 may form different scan chains, or may be coupled to one another to form a single combined scan chain. It will also be appreciated that memories 32 and logic 34 are highly abstracted in FIG. 3, and that practically any functional logic circuit may be implemented within these blocks consistent with the invention.

To illustrate an exemplary defect in a scan chain, a defective latch 40A is indicated in scan chain 38. In this example, latch 40A is considered to be "stuck-at-one", meaning that the latch consistently outputs a logic '1' value regardless of the data presented at its input for capture. It will be appreciated that a stuck-at-one condition may be caused by any number of factors, including, for example, a short or open circuit in the latch, or if a latch powers up to a one or zero and the defect is in a scan clock. It will also be appreciated that other defects in a latch may exist, including a "stuck-at-zero" condition, among others.

Figure 4A:
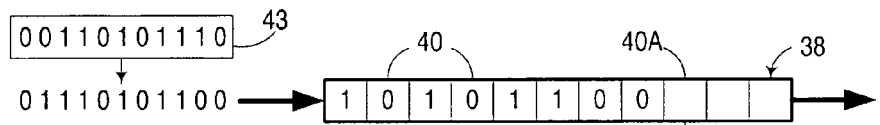
FIGS. 4A–4D illustrate the functional operation of the scan chain of FIG. 3 as a result of the defective latch.

The result of a stuck-at-one condition in latch 40A is further illustrated in FIGS. 4A–4D. As shown in FIG. 4A, for example, the input of an exemplary input stream to the SRI input of scan chain 38 is illustrated at 43. Reproduced below input stream 43 is a transposed version of the input to represent the order in which the input stream is fed into scan chain 38. As can be seen in the figure, the state of scan chain 38 after shifting in eight bits from the input stream is represented.

Figure 4B:
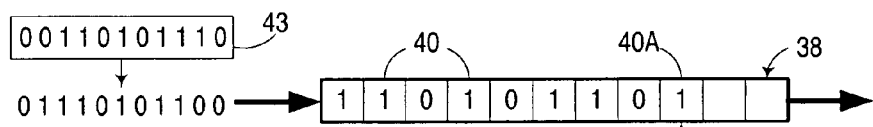
Figure 4C:
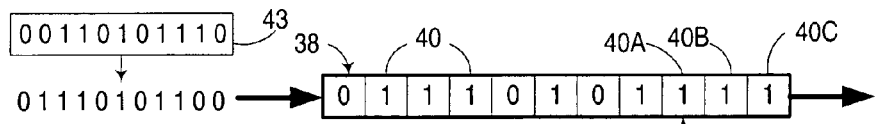
Figure 4D:
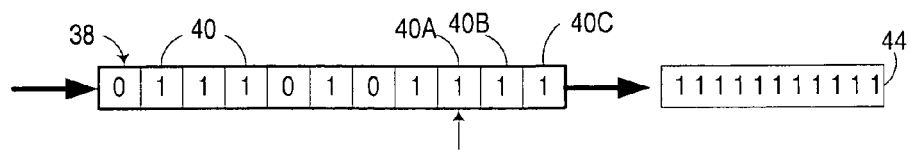

As shown in FIG. 4B, upon shifting in the ninth bit from the input stream into scan chain 38, the first bit (originally a logic '0' value) is flipped to a logic '1' value by defective latch 40A. Then, as shown in FIG. 4C, as the remaining two bits from the input stream are shifted into the scan chain, latch 40A passes logic '1' values to its subsequent latch 40B, irrespective of the data input to latch 40A. As a result, latches 40B and 40C, which are not defective, still contain corrupted data as a result of the defect in latch 40A. Moreover, as illustrated in FIG. 4D, once the data stored in scan chain 38 is scanned out, the resulting output stream 44 is corrupted by latch 40A.

As noted above, a defect in latch 40A such as a stuck-at-one condition can be detected via a flush test, where the A and B clocks for the scan chain are held active at the same time, and the SRI input is successively held at logic '0' and logic '1' values such that a defect is detected if the value present at the SRO output does not match that currently being applied to the SRI input.

In addition, a scan test can pick up some defects that a flush test cannot detect. With a scan test, a string of alternating logic '0''s and '1''s (e.g., 00110011 . . . ) are stepped through a scan chain by successively pulsing the A and B clocks and changing the values applied to the SRI input. A scan test, for example, may assist in detecting a defect that causes a clock line to be held on.

What flush tests and scan tests cannot determine, however, is precisely where a defect in a scan chain is located, i.e., which latch in a scan chain is the root of the defect.

Consistent with the invention, however, the location of a defect in a scan chain may be identified through the lateral application of test patterns to a scan chain, typically through the use of an ABIST engine that is already resident in the integrated circuit design.

As noted above, ABIST circuits are typically used to test embedded arrays on an integrated circuit device. An ABIST engine typically attempts to write test patterns to an array, read the test patterns previously written to the array, and compare the retrieved data to that originally written to the array. In this regard, the data read from an array is typically captured by a scan chain for output and analysis, e.g., by latches in a scan chain that are coupled to the data lines of an internal array bus or other forms of array outputs.

Returning to FIG. 3, an ABIST engine 42 is illustrated in device 30, and coupled to memories 32 for the purpose of testing the memories in a manner known in the art. Engine 42 is also coupled to combinational logic 34, and is capable of receiving test patterns from scan chain 36, and of outputting data to scan chain 38. As shown in the figure, ABIST engine 42 can be configured to test any number of memories 32. In other designs, and as illustrated at 42A, multiple ABIST engines may be provided. It will be appreciated that the precise operation and configuration of an ABIST engine can vary in different embodiments, and that the general use and configuration of a number of different ABIST engines are well known in the art.

Figure 5:
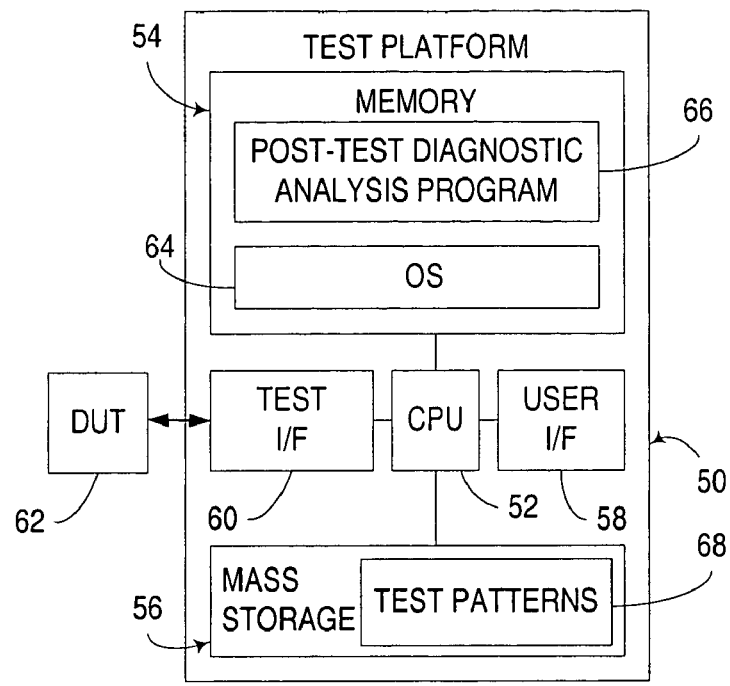
FIG. 5 is a block diagram of an apparatus suitable for detecting a broken scan chain in a device under test in a manner consistent with the invention.

Now turning to FIG. 5, an exemplary hardware and software environment is illustrated for an apparatus 50 suitable for implementing ABIST-assisted detection of scan chain defects consistent with the invention. In the illustrated embodiment, apparatus 50 is implemented as a test platform or "tester"; however, for the purposes of the invention, apparatus 50 may represent practically any type of computer, computer system or other programmable electronic device, including a client computer, a server computer, a portable computer, a handheld computer, an embedded controller, etc. Moreover, apparatus 50 may be implemented using one or more networked computers and/or programmable electronic devices, e.g., with different functions handled by different computers/devices.

As an example, apparatus 50 may be implemented as Automated Test Equipment (ATE) available from various manufactures, including Teradyne, and Hewlett Packard/Agilent, among others. It will be appreciated by one of ordinary skill in the art having the benefit of the instant disclosure, however, that a wide variety of alternate test platforms may be used in the alternative.

Apparatus 50 typically includes a central processing unit (CPU) 52 including one or more microprocessors coupled to a memory 54, which may represent the random access memory (RAM) devices comprising the main storage of apparatus 50, as well as any supplemental levels of memory, e.g., cache memories, non-volatile or backup memories (e.g., programmable or flash memories), read-only memories, etc. In addition, memory 54 may be considered to include memory storage physically located elsewhere in apparatus 50, e.g., any cache memory in a processor in CPU 52, as well as any storage capacity used as a virtual memory, e.g., as stored on a mass storage device 56 or on another computer or electronic device coupled to apparatus 50.

Apparatus 50 also typically receives a number of inputs and outputs for communicating information externally. For interface with a user or operator, apparatus 50 typically includes a user interface 58 incorporating one or more user input devices (e.g., a keyboard, a mouse, hard buttons, a trackball, a joystick, a touchpad, and/or a microphone, among others) and a display (e.g., a CRT monitor, an LCD display panel, and/or a speaker, among others). Otherwise, user input may be received via another computer or device, e.g., where apparatus 50 is implemented as a server or other form of multi-user computer.

For non-volatile storage, apparatus 50 typically includes one or more mass storage devices 56, e.g., a floppy or other removable disk drive, a hard disk drive, a direct access storage device (DASD), an optical drive (e.g., a CD drive, a DVD drive, etc.), and/or a tape drive, among others.

Furthermore, apparatus 50 may also include a test interface 60 for interfacing with a Device Under Test (DUT) 62, which may be, for example, an integrated circuit device, a multi-chip module, a plurality of such devices/modules disposed on a printed circuit board, or a complete electronic device incorporating one or more devices/modules/boards. Test interface 60 may therefore be implemented in such a manner as to provide suitable communication and control with DUT 62. It should also be appreciated that apparatus 50 typically includes suitable analog and/or digital interfaces between CPU 52 and each of components 54, 56, 58, and 60 as is well known in the art.

Apparatus 50 operates under the control of an operating system 64, and executes or otherwise relies upon various computer software applications, components, programs, objects, modules, data structures, etc. For example, a post-test diagnostic analysis program 66 may be resident in memory 54 to access apply a plurality of test patterns 68 (shown resident in mass storage 56) to DUT 62 to implement ABIST-assisted broken scan chain diagnostics consistent with the invention.

Moreover, various applications, components, programs, objects, modules, etc. may also execute on one or more processors in another computer coupled to apparatus 50 via a network, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable signal bearing media used to actually carry out the distribution. Examples of computer readable signal bearing media include but are not limited to recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the exemplary environment illustrated in FIG. 5 is not intended to limit the present invention. Indeed, those skilled in the art will recognize that other alternative hardware and/or software environments may be used without departing from the scope of the invention.

Figure 6:
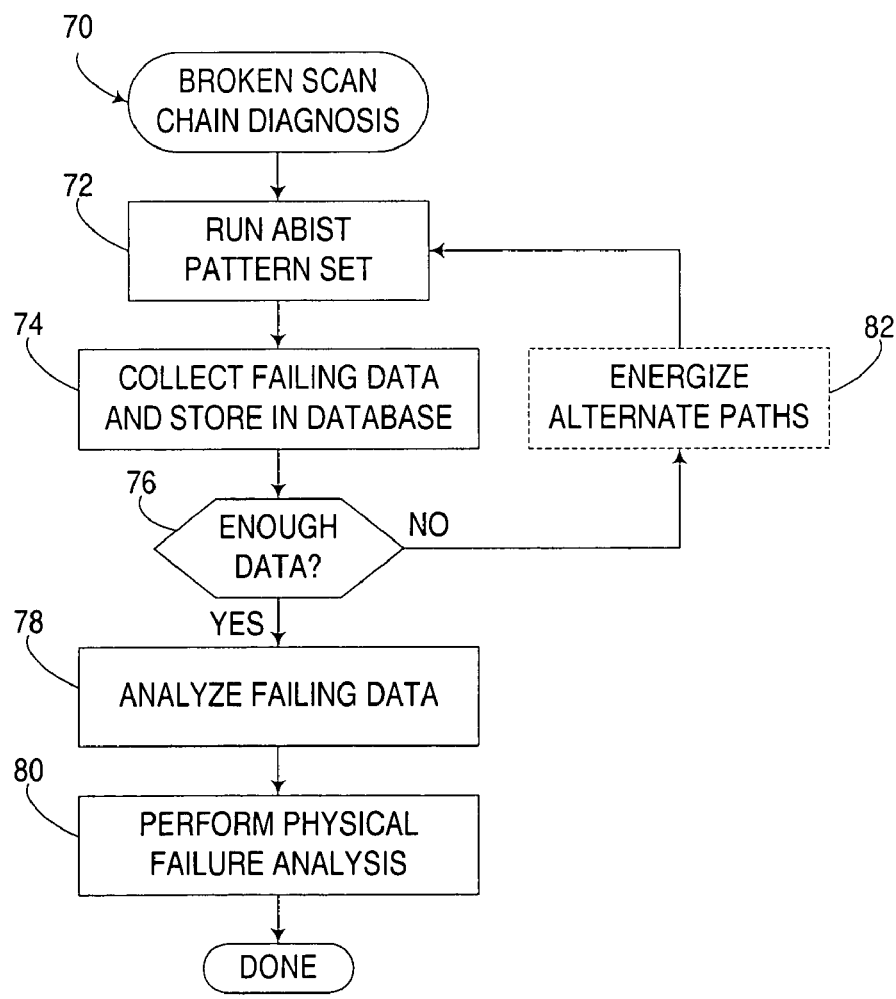
FIG. 6 is a flowchart illustrating the steps of a broken scan chain diagnosis method performed using the test platform of FIG. 5.

FIG. 6 next illustrates a broken scan chain diagnosis method 70 that may be performed utilizing apparatus 50 of FIG. 5. While method 70 may be utilized any time it is desirable to test the scan chains in an integrated circuit device, more typically method 70 is utilized after a broken scan chain is detected using a flush or scan test. It will also be appreciated that method 70 may be used during a post-manufacturing test such as yield testing or common mode analysis testing, and/or during field testing.

Method 70 begins in block 72 by running an ABIST pattern set, which involves partially loading the scan chain with data to initialize the ABIST engine and applying a number of system clocks.

Thereafter, the resulting data (referred to herein as "failing data") from exercising the ABIST engine is collected in block 74 and temporarily stored in a database.

Collection of the failing data may be via a single SRO if the scan chains are combined, or in the alternative, multiple, combined scan chains may be reconfigured into separate scan chains after capturing data, and output over separate SRO's to minimize the dependency on the combined scan chains and provide better diagnostic granularity.

Block 76 then determines whether enough failing data has been obtained. If so, the failing data is analyzed in block 78 to identify the defective latch, in a manner described in more detail below. Thereafter, various known physical failure analysis techniques may be performed in block 80 to identify the physical cause of the defective latch.

Returning to block 76, if insufficient data has been collected, it may be necessary to return to block 72 to run additional ABIST pattern sets. In connection with running additional ABIST pattern sets, it may also be desirable to energize alternate paths in the integrated circuit device, as illustrated in block 82. For example, some scan latches may not be directly writable to via the ABIST engine or circuit, and as such, it may be desirable to sensitize alternate paths in connection with applying ABIST test patterns to obtain greater resolution and allow more scan latches to be tested. In connection with sensitizing alternate paths, for example, scan chains may be combined, separated, bypassed, or reordered to ensure that all scan latches can be tested via the ABIST-assisted method described herein. As such, it will be appreciated that it may be desirable to design in sensitizable alternate scan paths in an integrated circuit design to ensure full test coverage of the scan latches resident in the design.

In addition, it may be desirable to reconfigure scan chains during multiple passes of ABIST operations to accelerate the identification of defective latches. For example, multiple scan chains may initially be combined into one or more longer scan chains for the purpose of initially identifying which of a plurality of scan chains contains a defective latch. Thereafter, only the scan chains that have been found to likely contain a defective latch may be individually tested to identify the defective latches therein (if any).

Figure 7A:
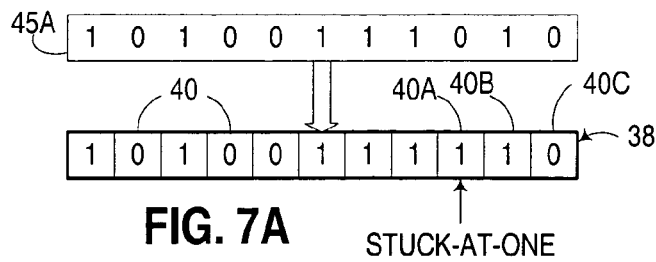
FIGS. 7A–7E illustrate the detection of a defective latch in an exemplary broken scan chain using the method of FIG. 6.
Figure 7B:
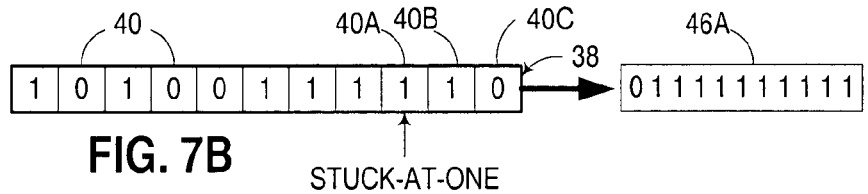

FIGS. 7A–7E next illustrate the application of method 70 to detect and locate defective latch 40A in scan chain 40 of FIGS. 3 and 4A–4D above. Specifically, FIG. 7A illustrates the application of a first test pattern 45A to scan chain 38 via ABIST engine 42, while FIG. 7B illustrates the resulting output stream 46A that would be output by scan chain 38 as a result of a scan out operation (note that the output stream is illustrated with the bits going left to right from MSB to LSB). As a result of the scan out operation, all but the two values latched into latches 40B and 40C (here the values '1' and '0') are forced to one by defective latch 40A.

Figure 7C:
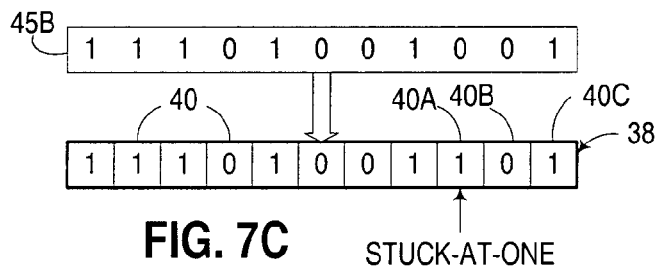
Figure 7D:
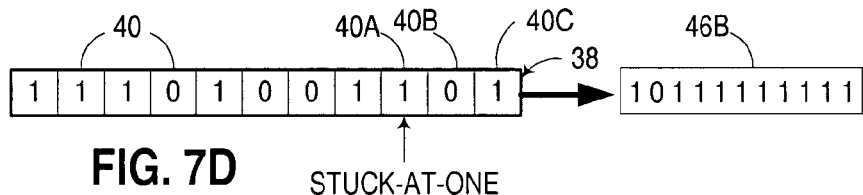

Likewise, FIG. 7C illustrates the application of a second test pattern 45B to scan chain 38 via ABIST engine 42, while FIG. 7D illustrates the resulting output stream 46B that would be output by scan chain 38 as a result of a scan out operation. As a result of the scan out operation, all but the two values latched into latches 40B and 40C (here the values '0' and '1') are forced to one by defective latch 40A. Of particular note to this example, test patterns 45A and 45B differ in the latch positions subsequent to defective latch 40A, and as a result, the data that is uncorrupted by latch 40A as a result of the scan out operation will differ for these two test patterns.

In this instance, the location of defective latch 40A may be identified as the first latch where all the data after that point is either stuck-at-zero or stuck-at-one. In some instances, the first bit in a string of stuck-at-zero or stuck-at-one outputs may not indicate the location of the defective latch, as some string of '0''s and '1''s may be expected in the latches prior to a stuck latch by a combination of logic/array design and power-up conditions.

Figure 7E:
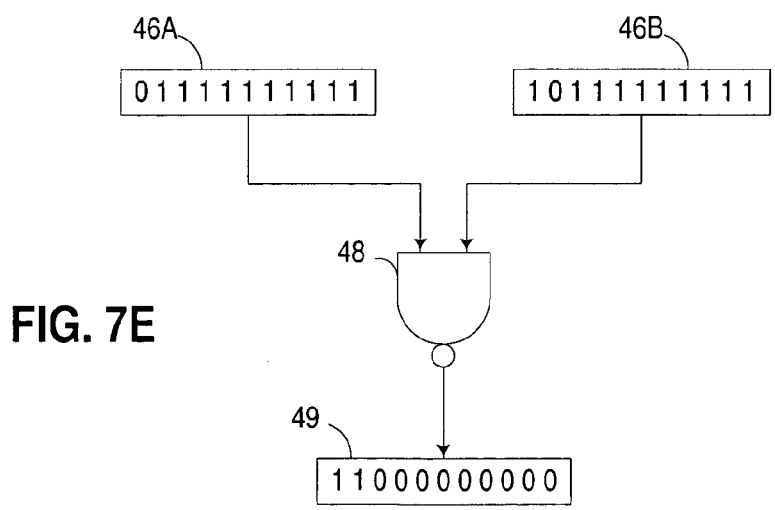

While a number of pattern analysis techniques may be used, in some instances, a relatively simple logical operation may be used to identify a defective latch. For example, as shown in FIG. 7E, simply performing a logical NAND operation (represented at 48) on output streams 46A and 46B would result in an output string 49 where the first '0' in the string (when followed by all zeros) represents the defective latch. Likewise, a logical NOR operation would be useful in detecting a stuck-at-zero condition.

It will be appreciated that the example set forth in FIGS. 7A–7E is greatly simplified, given the application of only two test patterns to a scan chain of only eleven latches. Nonetheless, it will be appreciated that similar techniques may be used to detect defective latches in much longer scan chains, and using substantially more test patterns. For example, many designs may incorporate hundreds or thousands of scan latches, whereby the number and length of the test patterns that may need to be substantially greater.

Typically, the test patterns used to test a given integrated circuit design are selected so as to consider all possible latch inversions in the scan chains. In addition, it may also be desirable to calculate the expected results and/or capture results from a known good device for comparison with the collected failure data. It will also be appreciated that analysis of the results may be performed using a number of different pattern matching and other mathematical techniques that will be apparent to one of ordinary skill in the art having the benefit of the instant disclosure.

Initial generation of test patterns, as well as the generation of the sensitized paths that may be associated with different sets of test patterns, may be performed with the assistance of a logic simulator or other design tool. Moreover, test patterns may be associated with particular paths when stored in memory for later retrieval during testing, such that the test platform appropriately configures the DUT prior to applying a set of test patterns associated with a particular configuration of scan paths.

It will also be appreciated that various steps associated with testing a DUT in the manner described herein may be performed manually, or some or all may be automated to facilitate testing. In addition, different steps may be performed by different computers or devices. For example, it may be desirable to utilize a test platform solely for collecting data generated via application of the test patterns, and then dump the collected data to a different computer for analysis.

It will be appreciated that the ABIST-assisted diagnostic method described herein provides the ability to identify and locate defective latches in a scan chain in a relatively fast and cost effective manner. Typically, little or no additional circuitry is required to support diagnostic testing in the manner described herein, as much of the circuitry, e.g., ABIST circuits are typically already utilized in many designs. Furthermore, for some designs, e.g., those lacking LBIST engines and/or those that are heavily populated with arrays, the likelihood of successfully diagnosing broken scan chains in the manner described herein is relatively high.

Various modifications may be made to the illustrated embodiments without departing from the spirit and scope of the invention. Therefore, the invention lies in the claims hereinafter appended.

What is claimed is:

1. A method of detecting a defect in a scan chain, the method comprising:
    applying a plurality of pattern sets to a scan chain using an array built-in self-test (ABIST) circuit coupled to the scan chain;
    collecting, from the scan chain, scan out data generated as a result of the application of the plurality of pattern sets to the scan chain; and
    using the collected scan out data to identify a defective latch in the scan chain.

2. The method of claim 1, further comprising:
    sensitizing at least one alternate path within which the scan chain is disposed; and
    applying a second plurality of pattern sets to the scan chain while the alternate path is sensitized.

3. The method of claim 1, wherein using the collected scan out data to identify the defective latch includes identifying a location of the defective latch in the scan chain.

4. The method of claim 1, further comprising performing at least one of a scan test and a flush test prior to applying the plurality of pattern sets to the scan chain.

5. The method of claim 1, wherein applying the plurality of pattern sets includes laterally inserting each pattern set into the scan chain using the ABIST circuit.

6. The method of claim 1, wherein collecting the scan out data includes serially stepping the scan out data through the scan chain to an output thereof.

7. The method of claim 1, further comprising reconfiguring the scan chain prior to collecting the scan out data.

8. An apparatus, comprising:
    a memory; and
    program code resident in the memory and configured to detect a defect in a scan chain disposed in an integrated circuit device by collecting, from the scan chain, scan out data generated as a result of an application of a plurality of pattern sets to the scan chain by an array built-in self-test (ABIST) circuit disposed in the integrated circuit device, and using the collected scan out data to identify a defective latch in the scan chain.

9. The apparatus of claim 8, wherein the program code is further configured to sensitize at least one alternate path within which the scan chain is disposed, and apply a second plurality of pattern sets to the scan chain while the alternate path is sensitized.

10. The apparatus of claim 8, wherein the program code is configured to use the collected scan out data to identify the defective latch by identifying a location of the defective latch in the scan chain.

11. The apparatus of claim 8, wherein the program code is further configured to perform at least one of a scan test and a flush test prior to applying the plurality of pattern sets to the scan chain.

12. The apparatus of claim 8, wherein the program code is configured to apply the plurality of pattern sets by laterally inserting each pattern set into the scan chain using the ABIST circuit.

13. The apparatus of claim 8, wherein the program code is configured to collect the scan out data by serially stepping the scan out data through the scan chain to an output thereof.

14. The apparatus of claim 8, wherein the program code is further configured to reconfigure the scan chain prior to collecting the scan out data.

15. The apparatus of claim 8, wherein at least a portion of the program code is resident in a test platform.

16. The apparatus of claim 15, wherein at least a second portion of the program code is resident in computer coupled to the test platform.

17. A program product, comprising:
   program code configured to detect a defect in a scan chain disposed in an integrated circuit device by collecting, from the scan chain, scan out data generated as a result of an application of a plurality of pattern sets to the scan chain by an array built-in self-test (ABIST) circuit disposed in the integrated circuit device, and using the collected scan out data to identify a defective latch in the scan chain; and
   a computer readable signal bearing medium bearing the program code.

18. The program product of claim 17, wherein the computer readable signal bearing medium includes at least one of a transmission medium and a recordable medium.

19. A method of detecting a defect in a scan chain, the method comprising:
   applying a first plurality of pattern sets to a scan chain coupled to an array built-in self-test (ABIST) circuit;
   collecting, from the scan chain, scan out data generated as a result of the application of the first plurality of pattern sets to the scan chain;
   using the collected scan out data to identify a defective latch in the scan chain;
   sensitizing at least one alternate path within which the scan chain is disposed; and
   applying a second plurality of pattern sets to the scan chain while the alternate path is sensitized.

20. An apparatus, comprising:
   a memory; and
   program code resident in the memory and configured to detect a defect in a scan chain disposed in an integrated circuit device by collecting, from the scan chain, scan out data generated as a result of an application of a first plurality of pattern sets to the scan chain by an array built-in self-test (ABIST) circuit disposed in the integrated circuit device, and using the collected scan out data to identify a defective latch in the scan chain, wherein the program code is further configured to sensitize at least one alternate path within which the scan chain is disposed, and apply a second plurality of pattern sets to the scan chain while the alternate path is sensitized.

* * * * *